US008081775B2

(12) United States Patent
Van Dijk

(10) Patent No.: US 8,081,775 B2
(45) Date of Patent: Dec. 20, 2011

(54) LOUDSPEAKER APPARATUS FOR RADIATING ACOUSTIC WAVES IN A HEMISPHERE AROUND THE CENTRE AXIS

(75) Inventor: Aldo Van Dijk, Tilburg (NL)

(73) Assignee: Robert Bosch GmbH, Stuttgart (DE)

( * ) Notice: Subject to any disclaimer, the term of this patent is extended or adjusted under 35 U.S.C. 154(b) by 633 days.

(21) Appl. No.: 12/301,062

(22) PCT Filed: Mar. 9, 2007

(86) PCT No.: PCT/EP2007/052247

§ 371 (c)(1),
(2), (4) Date: Nov. 17, 2008

(87) PCT Pub. No.: WO2008/110199

PCT Pub. Date: Sep. 18, 2008

(65) Prior Publication Data

US 2009/0245535 A1 Oct. 1, 2009

(51) Int. Cl.
*H03G 5/00* (2006.01)

(52) U.S. Cl. ........... 381/99; 381/61; 381/71.12; 381/87; 381/89

(58) Field of Classification Search .................... 381/61, 381/71.12, 87, 89, 99
See application file for complete search history.

(56) References Cited

U.S. PATENT DOCUMENTS 4,006,311 A 2/1977 Carlsson
4,399,328 A 8/1983 Franssen et al.
5,764,777 A * 6/1998 Goldfarb .......................... 381/27
6,394,223 B1 5/2002 Lehman
2006/0159287 A1 7/2006 Stiles et al.
2006/0182298 A1* 8/2006 Stiles et al. .................... 381/335
2007/0165878 A1* 7/2007 Konagai .......................... 381/89
2009/0304189 A1* 12/2009 Vinton ............................ 381/27

OTHER PUBLICATIONS

Kitzen W J W: "Mulitple Loudspeaker Arrays Using Bessel Coefficients" Electronic Components and Applications, Philips. Eindhoven, NL, vol. 5, No. 4, Sep. 1983, pp. 200-205, XP000763030.
Noboru Kyono, Susumu Fujiwara: "Active Realization of a Multiway Loudspeaker System With an "In-Phase" and "Livear-Phase" Crossover Network" Audio Engineering Society, [Online] May 3, 1985, XP002469106.
Wieslaw R. Woszczyk: "Bessel Filters As Loudspeaker Crossovers" Audio Engineering Society, [Online] Oct. 23, 1982, XP002469107.

* cited by examiner

*Primary Examiner* — Thanh V Pham
(74) *Attorney, Agent, or Firm* — Michael J. Striker

(57) ABSTRACT

Loudspeaker apparatus comprise commonly some sort of casings or assemblies, in which one or more single speakers are integrated and which are used to convert electrical signals into sound. A loudspeaker apparatus 1 for radiating sound in a hemisphere is disclosed having a center axis 9, the loudspeaker apparatus 1 comprising: a set of midrange drivers 6*a, b, c, d, e, f*, whereby the midrange drivers 6*a, b, c, d, e, f* are controlled and/or arranged in a Bessel configuration and are operable to provide a first acoustic field in the hemisphere, a set of tweeter drivers 7*a, b, c, d* adapted to provide a second acoustic field in the hemisphere, whereby the first and the second acoustic field are respectively arranged symmetrically, whereby the main sound emitting directions of the single tweeter drivers 7*a, b, c, d* are angled to the center axis 9.

13 Claims, 9 Drawing Sheets

Figure 1:
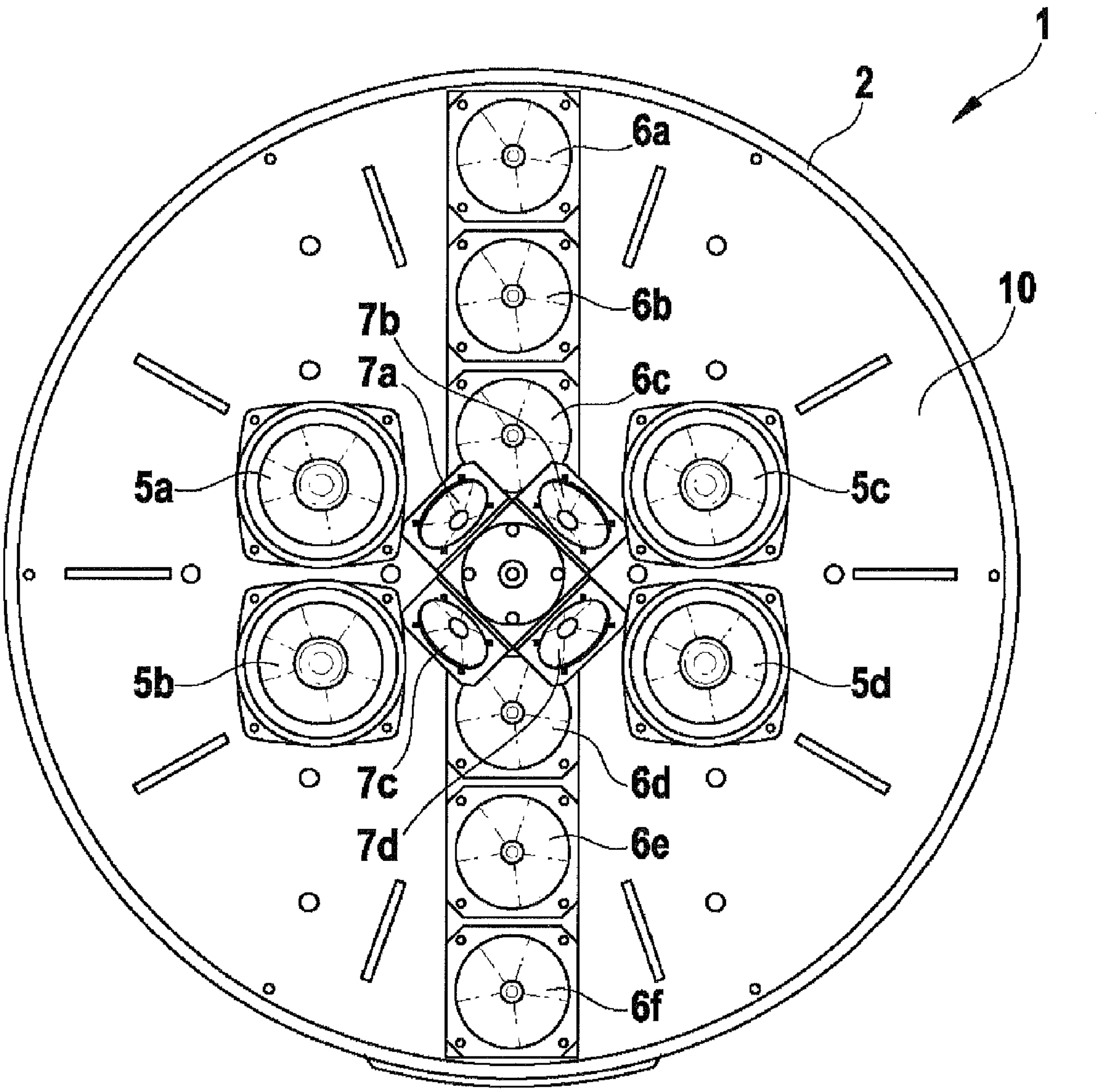

LOUDSPEAKER APPARATUS FOR RADIATING ACOUSTIC WAVES IN A HEMISPHERE AROUND THE CENTRE AXIS

STATE OF THE ART

The invention relates to a loudspeaker apparatus for radiating acoustic waves in a hemisphere with a centre axis, and more specifically to a loudspeaker apparatus comprising a set of midrange drivers, whereby the midrange drivers are controlled and/or arranged in a Bessel configuration and are operable to provide a first acoustic field in the hemisphere, a set of tweeter drivers adapted to provide a second acoustic field in the hemisphere, whereby the first and the second acoustic field are arranged symmetrically around the centre axis of the hemisphere, respectively.

Loudspeaker apparatus commonly comprise some sort of casings or assemblies, in which one or more single speakers are integrated and which are used to convert electrical signals into sound. Loudspeaker apparatus are often used in the private field in connection with hi-fi systems and in the public field as part of public address systems, which are informing or entertaining the public in buildings or public places, e.g. airports with music or acoustic information like announcements.

In order to provide a satisfying sound quality and equal sound conditions in various places in rooms which are radiated by the loudspeaker apparatus, it is preferred to use loudspeaker apparatus, which radiates their sound as a hemisphere, so that in each solid angle of the hemisphere the sound spectrum is equal. Of course this aim is not completely reachable, so that in each solid angle the sound spectrum is made as equal as possible. In order to realise an equal hemispherical distribution of the sound waves it is common to place a sphere in front of a loudspeaker or make use of a wave guide to force the sound to every direction. Another often used solution is to place the loudspeakers with their acoustic axes pointing at different angles to various directions.

The document U.S. Pat. No. 4,399,328 describes a direction and frequency independent column of electro-acoustic transducers (speakers) with substantially identical directivity patterns, which are equally spaced in a column. The transducers are connected to a common electrical transmission channel providing an electrical signal, so that—roughly spoken—each transducer emits the same acoustic information. In order to realise the direction and frequency independent distribution of the acoustic field generated by the column some of the transducers receive an amplitude-reduced and/or phase-shifted signal. The rules for the amplitude-reduction and the phase-shifting are based on the so-called Bessel function.

The document US 2006/0159287 A1, which appears to be the closest prior art, proposes MTM-loudspeakers for hifi-systems, in which the Ms (mid-range) and the Ts (tweeter) are constructed as a Bessel array and which are located a walls. In one of the preferred embodiments (FIG. 52) a loudspeaker cabinet is disclosed having a vertical column of transducers in a first Bessel configuration and a horizontal array of midrange or tweeter drivers in a second Bessel configuration, wherein the 0 position is occupied by a tweeter or a super tweeter.

SUMMARY OF THE INVENTION

According to the invention, a loudspeaker apparatus with the features of claim 1 is proposed. Preferred or advantageous embodiments of the invention are covered by the dependent claims, the description and/or the figures as attached.

The loudspeaker apparatus is adapted to radiate sound, for example announcements or music, in a hemisphere, whereby the spatial distribution of the acoustic waves shall be uniform or substantially uniform in order to provide the same acoustic and therefore listening conditions in the area covered by the hemisphere. The hemisphere has a centre axis traversing the centre point of the hemisphere and being symmetrically arranged within the hemisphere.

A set of preferably identical midrange drivers is provided in the loudspeaker apparatus, which are constructed in a Bessel configuration. The expression "driver" is herein preferably used for speaker, loudspeaker and/or transducer, so that—for example—a midrange driver is a midrange speaker or a midrange transducer.

The Bessel configuration preferably defines that the midrange drivers are arranged and/or controlled with a spatial and/or an amplitude-reduction and/or a phase-shifting distribution on basis of the Bessel function and/or derivates thereof, for example as disclosed in the documents U.S. Pat. No. 4,399,328 and/or US 2006/0159287 A1, which are both incorporated herein by reference, especially concerning the general rules and the various embodiments of the Bessel configuration. Preferably the midrange drivers are all identical and/or have identical or substantially identical directivity patterns and/or are spaced in equal distances from each other, whereby one or more empty places between the midrange drivers are allowed, representing midrange drivers with a zero amplitude. The midrange drivers are preferably controlled by electrical signals, which are all carrying the same acoustic information but differ by their amplitudes and/or their phase position, especially with phase differences of 180°. The set of midrange drivers is operable to generate a first acoustic field in the hemisphere.

In order to produce a second acoustic field in the hemisphere, overlying the first acoustic field, a set of preferably identical tweeter drivers is part of the loudspeaker apparatus. The tweeter drivers are preferably capable of reproducing the higher end of the audio spectrum, usually from somewhere around 3-5 kHz up to 20 kHz. The mid-range drivers are realised to cover lower frequencies, but also to cover or overlap with at least a part of the frequency band of the tweeter drivers. The first and the second acoustic field are each arranged in a symmetrical manner around the centre axis of the hemisphere, preferably the acoustic fields are arranged coaxial around the centre axis.

According to the invention, the main sound emitting directions of the single tweeter drivers are angled to the centre axis. One possible realisation is that the single tweeter is orientated so that its acoustic axis, which is preferably defined as an axis perpendicular to the emitting surface of the driver, is angled with respect to the centre axis, In another possible realisation a mechanical means being part of the loudspeaker apparatus reflects the sound waves of the single tweeter drivers so that after the reflection the main sound emitting direction is angled with respect to the centre axis. The mechanical means can for example be embodied as a sphere or a horn, which deflects the sound waves.

The inventor noted that most techniques for radiating sound with a "uniform" spatial distribution in a hemisphere introduces so-called colouring in the sound. Colouring may be defined as the hearing of different frequency spectrums depending on the listeners position. The reason for the colouring of sound is often that the techniques for radiating an "uniform" spatial distribution work for just a small part of the audio frequency range and work less for the other part of the range, so that this latter part will be the reason for the colouring of the sound.

In theory a real uniform spatial distribution in a hemisphere appears only possible in case the sound source is a point source, because only point sources radiate all frequencies equally in all directions in a spherical radiation pattern. In praxis and therefore in approximation a real driver can radiate like a (hemi-)sphere when the size of the membrane is small compared to the wavelength of the reproduced frequency. On the other hand side, the loudspeaker must be able to produce a sufficient sound pressure level. So the ideal loudspeaker apparatus that covers a large listening area with enough sound pressure level (SPL) should comprise one or more loudspeaker drivers with the following requirements: the size of the membrane must be small for the sphere radiating behaviour, the sensitivity should be high for reduction of the power needed and it should be capable of handling large powers to reach the desired SPL also at the edges of the listening area.

As these requirements are in direct conflict with each other, the underlying idea of the invention is to divide the whole audio bandwidth into at least two parts, which comprise a middle and a high frequency range part, whereby for each part a system configuration is used which represents a compromise of the three conditions and whereby the system configurations compensate the problems of each other.

Thus the advantages of the invention are that the perceptional sound-quality in the listening area is well balanced by the absence of colour, so that especially no perceptional frequency spectrum variations occur. This makes for example a message or an announcement close-by or under the loudspeaker apparatus have the same sound quality, i.e. frequency spectrum, as far away from the loudspeaker apparatus (with exception of the acoustic contribution of the room and amplitude variation). An audible beam forming is prevented or attenuated for the whole or part of the audio frequency spectrum, so that a large listening area with the whole frequency spectrum can be created. Furthermore the design of the housing of the loudspeaker apparatus can be designed flat compared to a sound-sphere solution, so that the loudspeaker apparatus is less obstructive.

In a preferred embodiment, the said main sound emitting directions of the tweeters are distributed in a regular manner, especially with a regular spacing or angle-distance, around the centre axis. Especially with the main sound emitting directions being projected in a plane perpendicular to the centre axis, the projected directions are distributed with equidistant angles. The regular distribution supports achieving the uniform distribution of the sound.

In other words or as alternative, the sound emitting directions of the single tweeters are orientated in different room angles of the or a second hemisphere. In a narrow mathematical definition this would imply that the sound emitting direction vectors cross or meet in the centre of the hemisphere. But the invention also comprises the possibility that the direction vectors meet in a point lying on the centre axis and thus being orientated in different room angles of a second hemisphere, which is placed with an offset along the centre axis with respect to the hemisphere.

In a preferred practical realisation the loudspeaker apparatus is designed so that the main sound emitting directions are orientated to high frequency short coming areas of the first acoustic field. The Bessel configuration of the set of midrange drivers usually leads to a sufficient uniform distribution of the sound with in the midrange frequency areas, but with higher frequencies, the uniformity of the first acoustic field deteriorates. In order to compensate the insufficient uniformity, the sound emitting directions are placed so that especially the "coloured areas" of the first acoustic field are supplied. As a result, the combination or addition of the first and the second acoustic field leads to a uniform overall acoustic field, whereby the deficiencies of the first and second acoustic field are compensated by the other field, respectively.

In a development of the invention the loudspeaker apparatus comprises a set of woofer drivers in order to provide a third acoustic field. The woofer drivers are adapted to the lowest frequencies. With this development, sound of all frequencies can be generated by the loudspeaker apparatus with a sufficient sound pressure level.

Within this development it is preferred, that the focussing axes and/or the acoustic axes and/or the main sound emitting directions of the single woofer drivers are arranged parallel to each other and/or to the centre axis and/or that the woofer drivers are provided with signals of the same phase. Especially the woofer drivers are not arranged in a Bessel configuration, so that the sound pressure level generated by the set of woofer drivers is not reduced due to amplitude-reduction or phase-shifting. The underlying idea is, that in view of woofer speakers, the size of the membrane is small compared to the wavelength of the reproduced frequency. So nor a Bessel configuration neither a spatial distribution of the focusing axes of the woofer drivers is needed to generate the uniform sound distribution.

Summarized, the loudspeaker apparatus preferably comprises the set of woofer drivers providing a third acoustic field in the range of low frequencies, which is uniform due to the ratio of membrane diameter (or equivalent sound generating means) and the reproduced frequencies, the set of midrange speakers providing the first acoustic field, which is uniform in the range of midrange frequencies due to the Bessel configuration and a set of tweeter speakers providing the second acoustic field, which is—in connection or in combination with the first acoustic field—uniform in the range of high frequencies. So an overall acoustic field being uniform in all frequencies is generated by the loudspeaker apparatus.

In a practical realisation, the loudspeaker apparatus comprises a filter apparatus adapted to provide the set of midrange drivers with a middle and a high pass signal, to provide the set of tweeter drivers with the high pass signal and—optionally—to provide the set of woofer drivers with a low pass signal. As the second acoustic field concerning the high frequencies is only uniform in case it is combined with the first acoustic field, the high pass signal is guided to the set of tweeter drivers and to the set of mid-range drivers. In this connection it shall be underlined that the set of midrange drivers in Bessel configuration shows an attenuation of sound pressure level or amplitude of the output signal in the higher frequencies, which is compensated by the additional sound pressure level or amplitude from the second acoustic field. The filter apparatus is for example realised as a passive filter, whereby capacitors, resistors and inductors are positioned between the power amplifier and the loudspeaker driver. As an alternative the filter apparatus is an active filter, for example an electronic circuit or digital sound processor positioned before the input of the power amplifier(s).

Although the set of midrange drivers may be arranged in any Bessel configuration, especially in column or square arrangement, it is preferred that the set of midrange drivers is arranged as a seven-element Bessel column having only six midrange drivers.

The amplitude reduction factors of the seven Bessel-elements are for example [+0.5; +1; +1; 0; −1; +1; −0.5], whereby the factor 1 means the full amplitude, the factor 0.5 the half amplitude, the factor 0 the unpopulated driver position, the factor −0.5 the half amplitude, phase shifted for 180° and the factor −1 the full amplitude, phase-shifted for 180°.

Furthermore it is preferred that the set of tweeter drivers has exactly four tweeter drivers with their acoustic axes are angled, for example for 125°, relative to an emitting surface plane of the set of midrange drivers. In this embodiment it is additionally preferred that the acoustic axes projected in the emitting surface plane along the centre axes are angled for 90° to each other and/or have an angle of 45', 135°, 225° and 315° relative to the extension of the Bessel-column. Preferably the set of tweeter drivers is arranged protruding to the emitting surface plane.

In a further development, the set of woofer drivers have exactly four woofer drivers which are arranged in a rectangle, whereby preferably one side is parallel to the Bessel column. It is furthermore preferred that an emitting surface plane of the set of woofer drivers is identical or at least parallel to the emitting surface plane of the set of midrange drivers.

For the practical realisation the set of midrange drivers and the set of tweeter drivers and optionally the set of woofer drivers are integrated in a common casing or cabinet, so that a space-saving solution for a loudspeaker system is achieved. Preferably the casing is disk-shaped and/or the loudspeaker apparatus is realised as ceiling loudspeaker or a pendant loudspeaker especially for a public address system or sound reinforcement systems for example for speech and or music reproduction.

SHORT DESCRIPTION OF THE DRAWINGS

Figure 2:
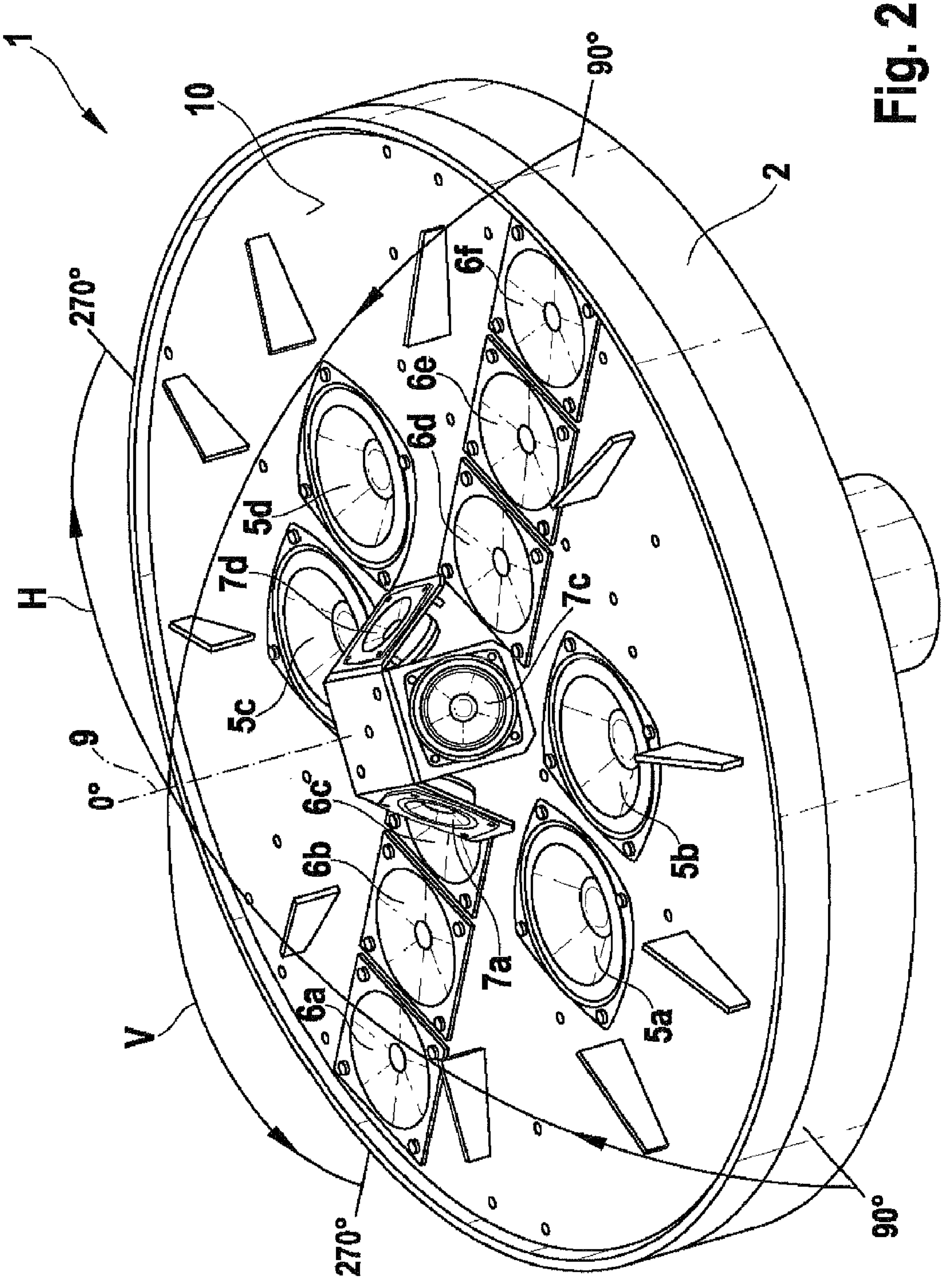
Figure 3:
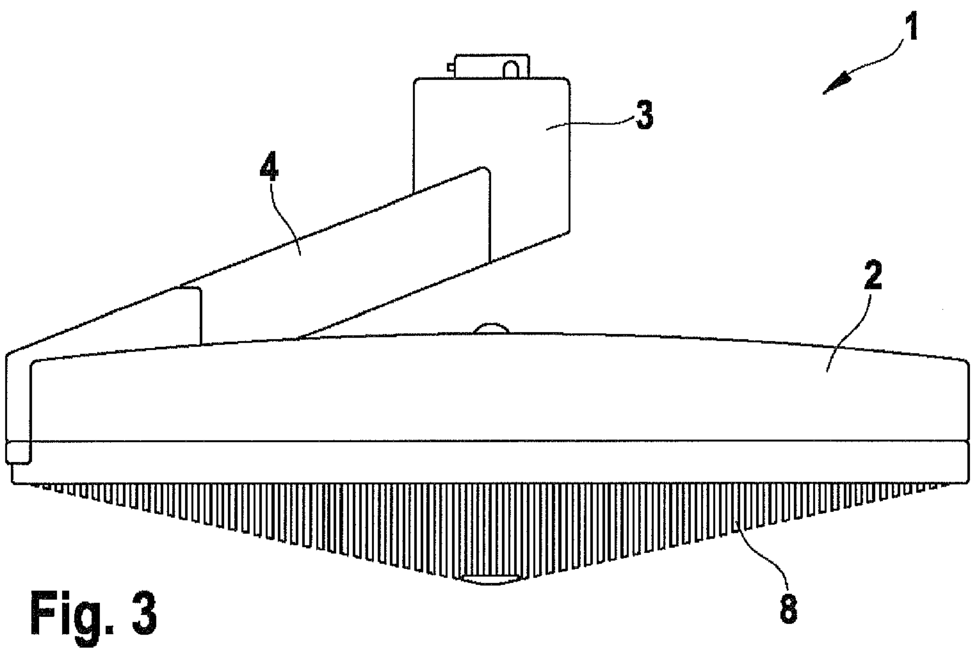
Figure 4:
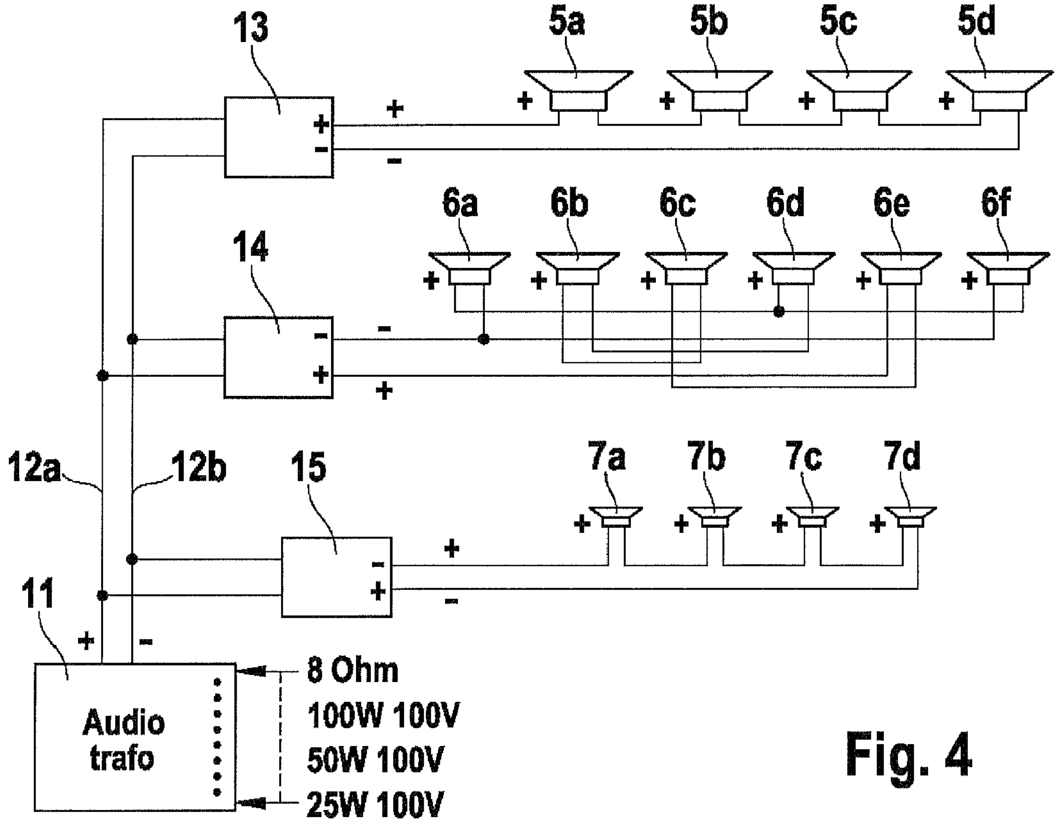
Figure 5:
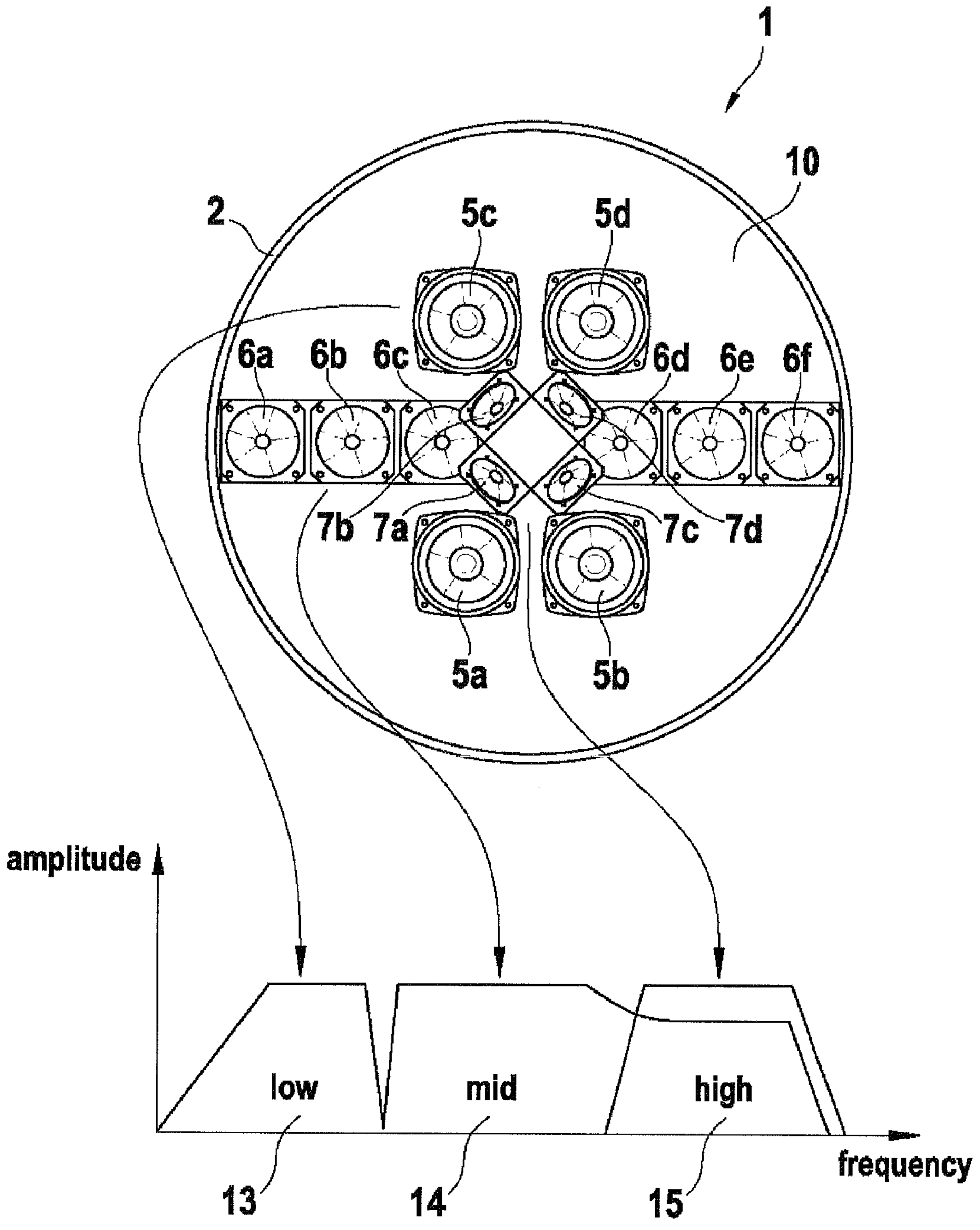
Figure 6A:
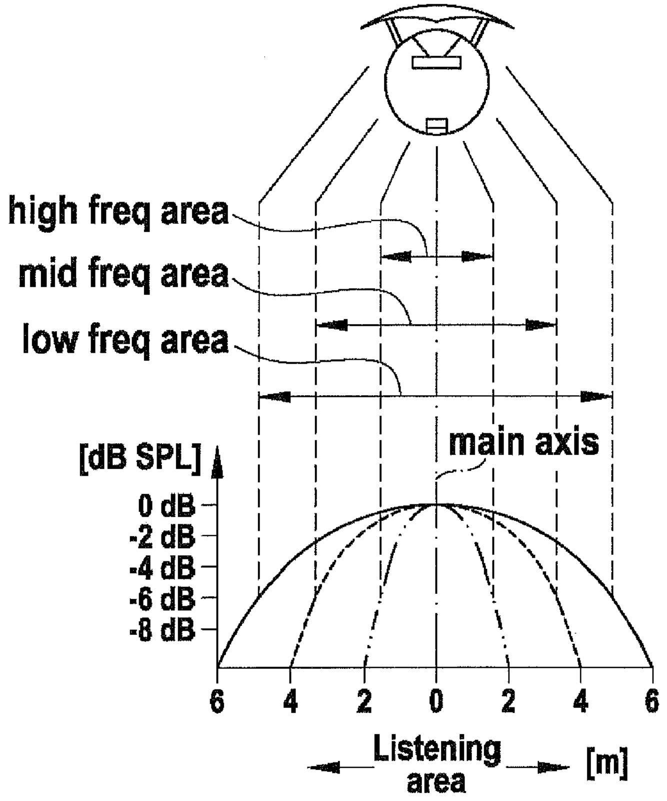
Figure 7A:
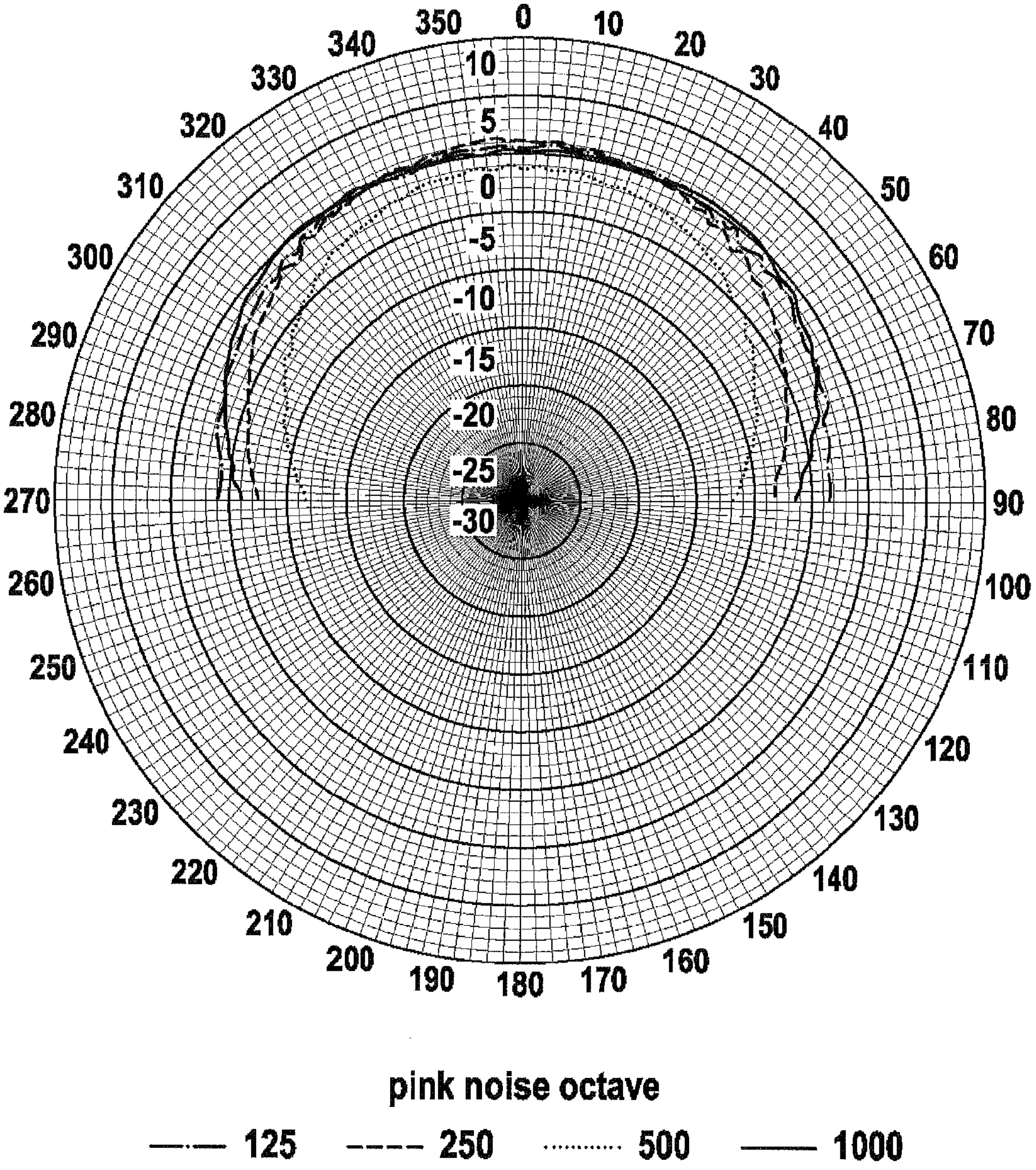
Figure 7B:
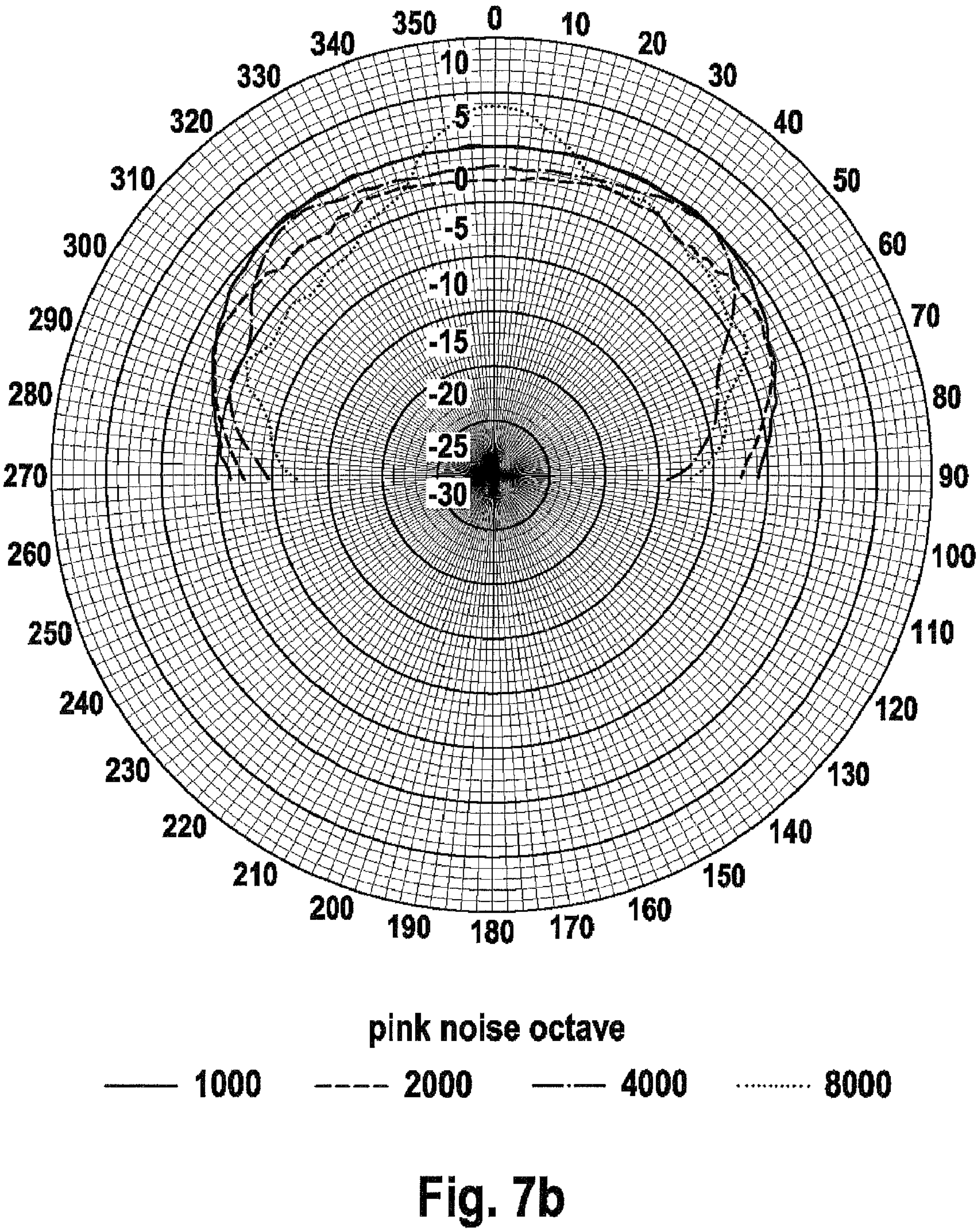
Figure 8A:
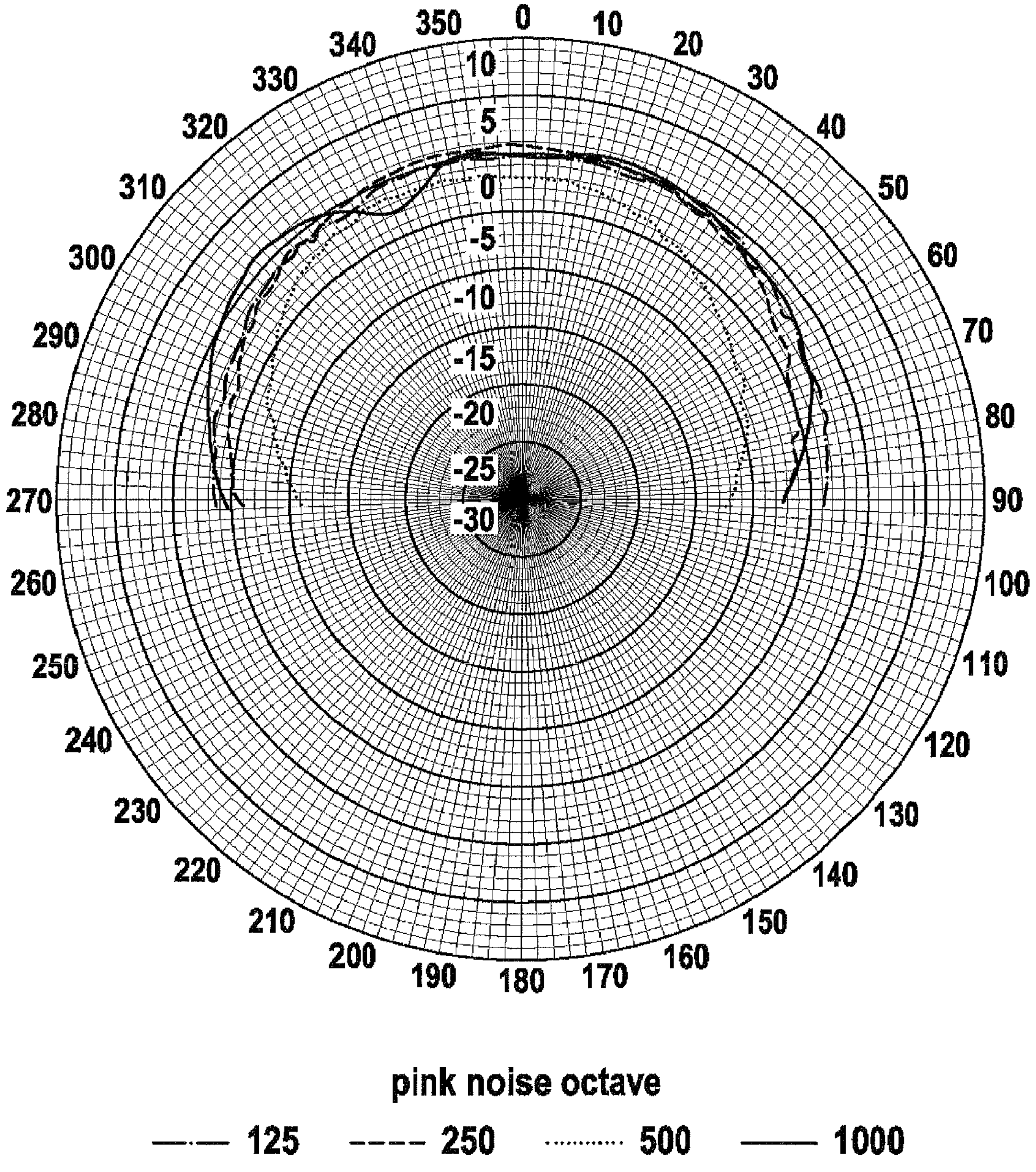
Figure 8B:
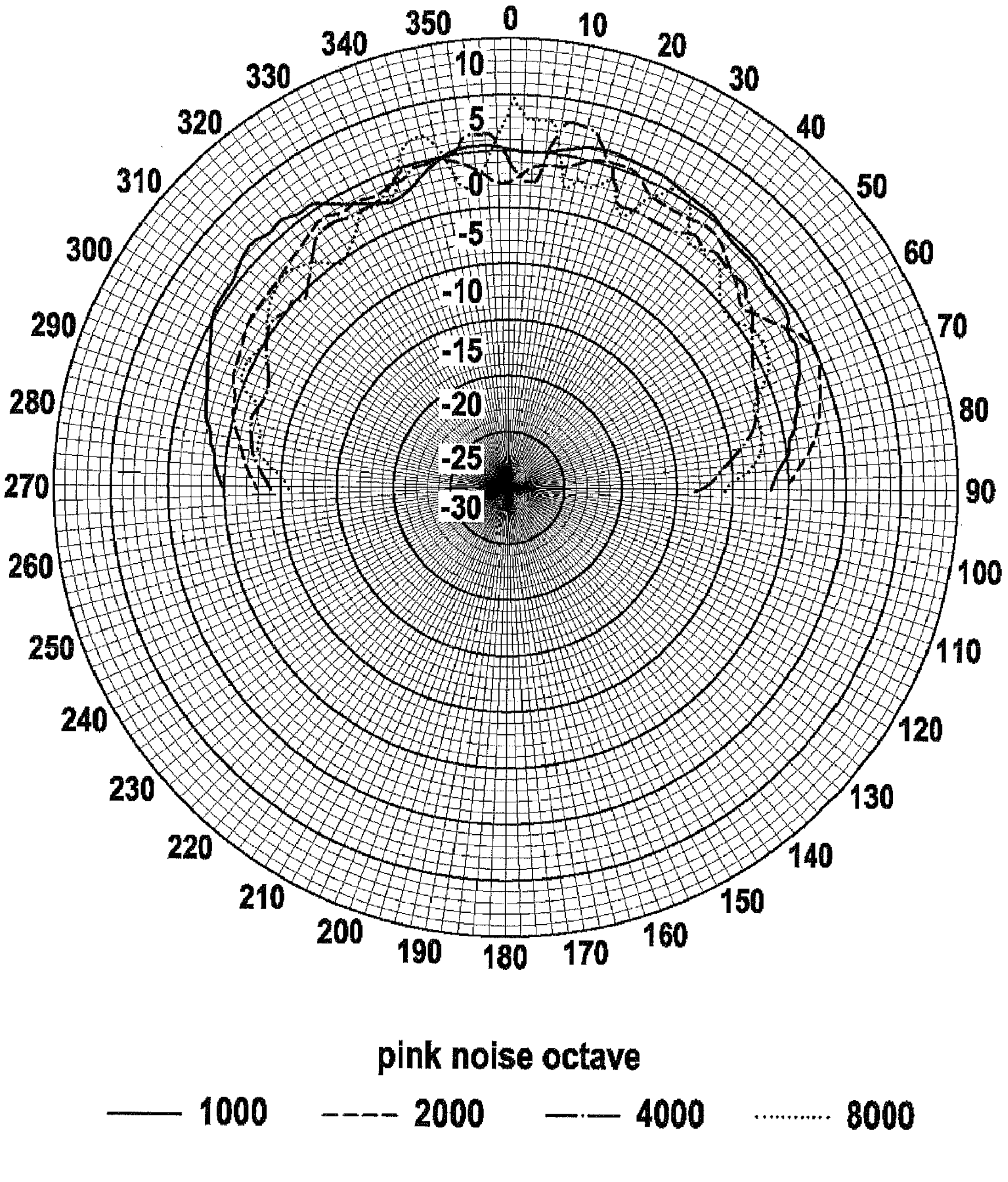

Further features, advantages and effects of the present invention are disclosed in the following description and drawings of a preferred embodiment of the invention, whereby the figures show:

FIG. 1 a schematic top view of a loudspeaker apparatus as an embodiment of the invention;

FIG. 2 a schematic diagonal view of the loudspeaker apparatus in FIG. 1;

FIG. 3 a schematic side view of the loudspeaker apparatus in FIGS. 1 and 2:

FIG. 4 a block diagram illustrating the circuitry of the loudspeaker apparatus in FIGS. 1, 2 and 3;

FIG. 5 an illustration for explaining the characteristic of the filter in the loudspeaker apparatus in FIGS. 1, 2 and 3;

FIG. 6*a, b* an illustration showing a comparison between the characteristic of a loudspeaker according to the state of the art and the loudspeaker apparatus in FIGS. 1, 2 and 3;

FIGS. 7*a, b*, measurement results from the loudspeaker apparatus in FIGS. 1, 2 and 3 in form of a horizontal polar diagram showing the angular distribution of the amplitude level for various frequencies in Hz;

FIGS. 8*a, b*, measurement results from the loudspeaker apparatus in FIGS. 1, 2 and 3 in form of a vertical polar diagram showing the angular distribution of the amplitude level for various frequencies in Hz;

In all figures same numbers designate same parts.

PREFERRED EMBODIMENT OF THE INVENTION

FIGS. 1, 2 and 3 show a schematic top, diagonal and side view of a loudspeaker apparatus 1 as an embodiment of the invention. The loudspeaker apparatus 1 comprises a cabinet 2, which is in top-view circular formed and in the side view flattened, so that it shows a disk-like shape. The overall diameter of the cabinet 2 is for example 1.20 m. The cabinet 2 can be fixed to a ceiling with the foot 3, which extends on the backside from the border of the cabinet 2 to a central arranged fixing means 4, so that the loudspeaker apparatus is realised as a ceiling loudspeaker system. The loudspeaker apparatus 1 may be part of a public address system as used in airports or the like.

The loudspeaker apparatus 1 comprises three different sets of drivers, a set of woofer drivers 5*a, b, c, d*, a set of midrange drivers 6*a, b, c, d, e, f* and a set of tweeter drivers 7*a, b, c, d*, whereby the diameters of the tweeter drivers 7*a, b, c, d* are smaller than the diameters of the midrange drivers 6*a, b, c, d, e, f* and the diameters of the midrange drivers are smaller than the diameters of the woofer drivers 5*a, b, c, d*. In a possible realisation the woofer drivers 5*a, b, c, d* have a membrane diameter of 11.5 cm connected in series, the midrange drivers 6*a, b, c, d, e, f* have a membrane diameter of 9.0 cm connected into a Bessel function and the tweeter drivers 7*a, b, c, d* are realised as cone drivers with a membrane diameter of 5.5 cm being connected in series. The front side of the loudspeaker apparatus 1 is covered by a covering 8, for example a grille.

For matter of definition a centre axis 9 (FIG. 2) is defined, extending perpendicularly in the middle from the front surface 10 of the loudspeaker apparatus, which is additionally defined as the centre axis of a hemispherical acoustic field to be generated by the loudspeaker apparatus 1. The set of midrange drivers 6*a, b, c, d, e, f* is arranged in a line or column lying in or parallel to the plane of the front surface 10, whereby the single midrange drivers 6*a, b, c, d, e, f* are equidistant placed with the exception that the central position, which is centrally traversed by the centre axis 9 is not occupied and thus empty. This empty position represents a driver with an amplitude weighting of 0, as it will be explained later. The set of woofer drivers 5*a, b, c, d* is arranged in form of a rectangle lying in or parallel to the plane of the front surface 10, whereby the centre of the rectangle is positioned on the centre axis 9. The rectangle comprises a long side and a short side, whereby the long side is arranged perpendicularly relative to the extension of the column of the midrange drivers 6*a, b, c, d, e, f*. The column and the rectangle are arranged in the same plane, so that the column divides the rectangle in two halves. The set of tweeter drivers 7*a, b, c, d* protrudes over the front surface 10, whereby each single tweeter driver 7*a, b, c, d* is angled for 125° relative to the front surface 10. In top view the tweeter drivers 7*a, b, c, d* are arranged symmetrically around the centre axis 9, so that their common centre is positioned on the centre axis 9, and are angled for 45°, 135°, 225° and 315° relative to the extension of the column and/or 90° to each other. The reason for positioning the tweeter drivers 7*a, b, c, d* in the centre of the loudspeaker apparatus 1 and/or in the centre of the other driver sets is that the origin behaviour, which means that all sound (low, mid and high frequencies) is coming from one central point. This reduces the phase shifting between the different frequency groups.

FIG. 4 shows a schematic block diagram illustrating the wiring or circuitry of the loudspeaker apparatus 1. An audio transformer 11 provides a common audio signal, which is guided by main lines 12*a, b* to the three filters 13, 14 and 15, which are arranged in parallel and which selectively filter the common audio signal for the three sets of drivers.

The set of woofer drivers 5*a, b, c, d* and the set of tweeter drivers 7*a, b, c, d* are connected in series, whereby the set of midrange drivers 6*a, b, c, d, e, f* are connected in such a way that the amplitude has the same weighting function as a $7^{th}$ order Bessel function. The following table shows the distribution:

| Driver | Amplitude weighting |
|---|---|
| 6a | 1 |
| 6b | 2 |
| 6c | 2 |
| Unoccupied position | 0 |
| 6d | −2 |
| 6e | 2 |
| 6f | −1 |

For example driver 6*b* has a two time higher voltage than driver 6*a*. Driver 6*e* has the same voltage as driver 6*c*, but it is connected in reverse (180° phase shifting). The unoccupied position has the amplitude weighting 0, thus no driver is placed at the middle position of the column in the loudspeaker apparatus 1.

FIG. 5 illustrates the filter characteristics of the filters 13, 14 and 15 in FIG. 4, whereby for each filter 13, 14 and 15 the their position into the frequency range is shown. The filters 13, 14 and 15 are for example realised as cross-over filters, whereby the filter characteristics are adapted, so that the drivers get only the audio signal for the frequency range, where they have the best acoustical performance. The filter 13 is designed as a low-pass and the filter 15 as a high pass filter. The filter 14 is a band-pass filter, overlapping with the filter 13 or—as it is shown in FIG. 5—being designed that a minimum or a zero is between the filter 13 and 14 in the overall filter characteristic. In the range of the higher frequencies, filter 14 and 15 overlap, whereby the filter 14 is reduced in the overlapping area. Thus set of midrange drivers 6*a, b, c, d, e, f* and set of tweeter drivers 7*a, b, c, d* both receive the audio signal in the range of the higher frequencies.

The principle of the loudspeaker apparatus is that in the range of the low frequencies, the woofer drivers 5*a, b, c, d* generate a uniform sound field in the hemisphere defined by the centre axis 9*a* due to the effect that the wavelengths corresponding to the filtered audio signal are large compared to the diameter of the membranes, that in the range of middle frequencies, the midrange drivers 6*a, b, c, d, e, f* generate a uniform sound field due to the Bessel configuration and that in the higher frequencies the set of tweeter drivers 7*a*, b, c, d and the set of midrange drivers 6*a, b, c, d, e, f* generate together a uniform sound field due to the Bessel configuration of the set of midrange drivers 6*a, b, c, d, e, f* and the spatial orientation of the tweeter drivers 7*a, b, c, d*.

Figure 6B:
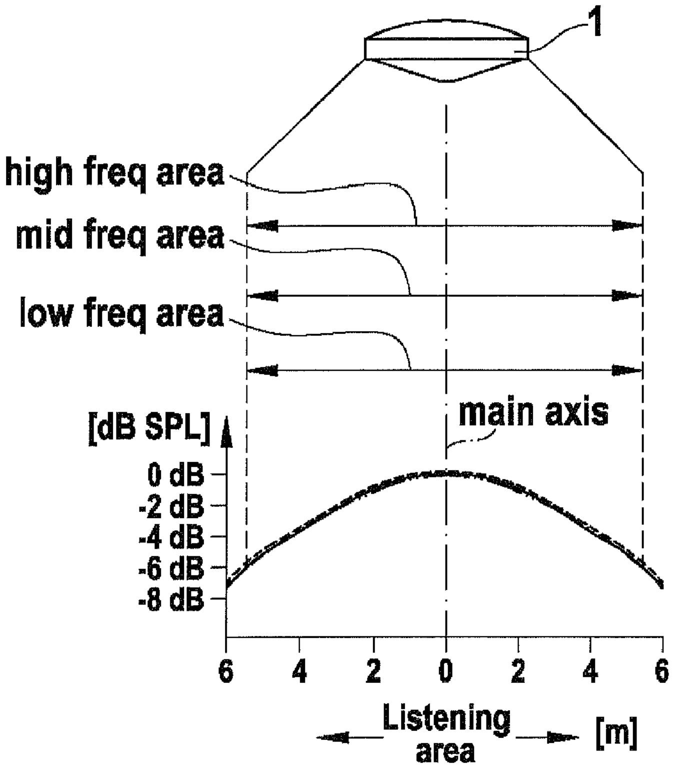

FIG. 6*a* and 6*b* show a schematic comparison between a loudspeaker according to the state of the art (FIG. 6*a*) and the loudspeaker apparatus 1 in the FIGS. 1, 2 and 3 (FIG. 6*b*). In FIG. 6*b* only in the central portion within a range from −2 to +2 meters, all frequencies show the same sound pressure level, in the area from 2 to 4 meters or from −2 to −4 meters the sound pressure level of the high frequencies is already deteriorated for −8 dB and more. In the area from 4 to 6 meters or 4 to −6 meters only the low frequencies show a sufficient sound pressure level so that in these areas the sound will be dull. FIG. 6*b* show a uniform distribution for all frequency ranges, so that also in the area between 4 and 6 or −4 and −6 meters no colouring of the sound occurs in comparison with the centre area. It shall be underlined that FIGS. 6*a* and 6*b* are intended to show the differences between conventional loudspeaker and the loudspeaker apparatus 1, whereby the real size of the listening area depends on a variety of parameters, for example the mounting height of the loudspeaker apparatus 1.

FIGS. 7*a, b* and 8*a, b* show measurements results expressed in polar diagrams starting at 90° axis, going to 0° (centre axis 9) and ending at 270° axis, whereby the angular distribution of the amplitude in view of different frequencies are shown. FIGS. 7*a* and *b* show a horizontal polar response of the loudspeaker apparatus, whereby the horizontal plane is defined as being perpendicular to the column of the set of midrange drivers 6*a, b, c, d, e, f* in FIG. 2, whereby the horizontal plane is indicated by the letter H. In the frequency range from 125 Hz to 4000 Hz, the response curves are very similar to each other over the whole angle from 90° to 270°. The curve concerning the frequency of 8000 Hz shows a slight maximum at the 0° position but is also strong at the other angles. FIGS. 8*a, b* show the vertical polar response of the loudspeaker apparatus 1, whereby the vertical plane (FIGS. 8*a* and *b*) is indicated by a V in FIG. 2. The response in the vertical plane is even more uniform than in the horizontal plane as also the curve concerning the frequency of 8000 Hz has the same or nearly the same response as the curves of the other frequencies.

The invention claimed is:

1. Loudspeaker apparatus (1) for radiating sound in a hemisphere having a centre axis (9), the loudspeaker apparatus (1) comprising a set of midrange drivers (6*a, b, c, d, e, f*), whereby the midrange drivers (6*a, b, c, d, e, f*) are controlled and/or arranged in a Bessel configuration and are operable to provide a first acoustic field in the hemisphere, a set of tweeter drivers (7*a, b, c, d*) adapted to provide a second acoustic field in the hemisphere, whereby the first and the second acoustic fields are respectively arranged symmetrically around the centre axis (9) of the hemisphere, characterised in that the main sound emitting directions of the single tweeter drivers (7*a, b, c, d*) are angled to the centre axis (9).

2. Loudspeaker apparatus (1) according to claim 1, characterised in that the main sound emitting directions of the single tweeter drivers (7*a, b, c, d*) are distributed regularly around the centre axis.

3. Loudspeaker apparatus (1) according to claim 1, characterised in that the main sound emitting directions of the single tweeter drivers (7*a, b, c, d*) are orientated in different room angles of the hemisphere.

4. Loudspeaker apparatus (1) according to claim 1, characterised in that the main sound emitting directions of the single tweeter drivers (7*a, b, c, d*) are orientated to high frequency short coming are as of the first acoustic field.

5. Loudspeaker apparatus (1) according to claim 1, characterised in further comprising a set of woofer drivers (5*a, b, c, d*) adapted to provide a third acoustic field in the hemisphere, being symmetrically or coaxially arranged around the centre axis of the hemisphere.

6. Loudspeaker apparatus (1) according to claim 5, characterized in that the focussing directions of the woofer drivers (5*a, b, c, d*) are arranged parallel to each other and/or to the centre axis (9).

7. Loudspeaker apparatus (1) according to claim 5, characterised in that the woofer drivers (5*a, b, c, d*) are connected in series.

8. Loudspeaker apparatus (1) according to claim 1, characterised by a filter apparatus, preferably comprising active or passive filters, adapted to provide the set of mid-range drivers (6*a, b, c, d, e, f*) with a middle and a high pass signal, to provide the set of tweeter drivers (7*a, b, c, d*) with the high pass signal and - optionally - to provide the set of woofer drivers (5*a, b, c, d*) with a low pass signal.

9. Loudspeaker apparatus (1) according to claim 1, characterised in that the set of midrange drivers (6*a, b, c, d, e, f*) is arranged as a seven-element Bessel column having only six midrange drivers.

10. Loudspeaker apparatus (1) according to claim 1, characterised in that the set of tweeter drivers (7*a, b, c, d*) have exactly four tweeter speakers which are arranged angled relative to an emitting surface plane of the set of midrange drivers (6*a, b, c, d, e, f*).

11. Loudspeaker apparatus (1) according to claim 1, characterised in that the set of woofer speakers (5*a, b, c, d*) have exactly four woofer drivers which are arranged in a rectangle.

12. Loudspeaker apparatus (1) according to claim 1, characterised in that the set of mid range speakers (6*a, b, c, d, c, f*) and the set of tweeter speakers (7*a, b, c, d*) and—optionally the set of woofer speakers (5*a, b, c, d*) are arranged in or on a common casing (2).

13. Loudspeaker apparatus (1) according to claim 1, characterised by being realised as a ceiling loudspeaker apparatus and/or as an pendant loudspeaker apparatus.

* * * * *